US009171840B2

(12) United States Patent
Sakata

(10) Patent No.: US 9,171,840 B2
(45) Date of Patent: Oct. 27, 2015

(54) SEMICONDUCTOR DEVICE AND MANUFACTURING METHOD THEREOF

(75) Inventor: Junichiro Sakata, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 470 days.

(21) Appl. No.: 13/478,675

(22) Filed: May 23, 2012

(65) Prior Publication Data

US 2012/0298987 A1 Nov. 29, 2012

(30) Foreign Application Priority Data

May 26, 2011 (JP) ................................ 2011-117516

(51) Int. Cl.
H01L 29/22 (2006.01)
H01L 27/06 (2006.01)
H01L 27/12 (2006.01)
H01L 29/417 (2006.01)

(52) U.S. Cl.
CPC ........ *H01L 27/0688* (2013.01); *H01L 27/1203* (2013.01); *H01L 27/127* (2013.01); *H01L 27/1225* (2013.01); *H01L 27/1244* (2013.01); *H01L 29/41733* (2013.01)

(58) Field of Classification Search
CPC ............ H01L 27/0688; H01L 27/1203; H01L 27/127; H01L 27/1225; H01L 27/1244; H01L 29/41733; H01L 29/786; H01L 27/06; H01L 29/22
USPC .......... 257/43, 60, 66, 71, E29.296, E29.094, 257/E27.016
See application file for complete search history.

(56) References Cited

U.S. PATENT DOCUMENTS 4,668,968 A * 5/1987 Ovshinsky et al. ............. 257/61
4,700,458 A * 10/1987 Suzuki et al. ................. 438/160
5,200,634 A * 4/1993 Tsukada et al. ............... 257/291

(Continued)

FOREIGN PATENT DOCUMENTS

EP 1737044 A 12/2006
EP 2226847 A 9/2010

(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Asok K Sarkar
*Assistant Examiner* — Dmitriy Yemelyanov
(74) *Attorney, Agent, or Firm* — Eric J. Robinson; Robinson Intellectual Property Law Office, P.C.

(57) ABSTRACT

An offset transistor and a non-offset transistor each including an oxide semiconductor are formed over one substrate. An oxide semiconductor layer, a gate insulator, and first layer wirings which serve as gate wirings are formed. After that, the offset transistor is covered with a resist and impurities are mixed into the oxide semiconductor layer, so that an n-type oxide semiconductor region is formed. Then, second layer wirings are formed. Through the above steps, the offset transistor and the non-offset transistor (e.g., aligned transistor) can be formed.

11 Claims, 8 Drawing Sheets

(56) References Cited

U.S. PATENT DOCUMENTS

| | | | |
|---|---|---|---|
| 5,612,235 A * | 3/1997 | Wu et al. | 438/158 |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,468,901 B2 | 12/2008 | Kameshiro et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0025678 A1 | 2/2010 | Yamazaki et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0117073 A1 * | 5/2010 | Yamazaki et al. | 257/43 |
| 2010/0163868 A1 * | 7/2010 | Yamazaki et al. | 257/43 |
| 2011/0032444 A1 * | 2/2011 | Yamazaki et al. | 349/42 |
| 2011/0058116 A1 | 3/2011 | Yamazaki et al. | |
| 2011/0216571 A1 | 9/2011 | Yamazaki et al. | |
| 2011/0278571 A1 | 11/2011 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Dembo.H et al., "RFCPUS on Glass and Plastic Substrates Fabricated by TFT Transfer Technolgy,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

(56) References Cited

OTHER PUBLICATIONS

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3 and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Chara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display

(56) References Cited

OTHER PUBLICATIONS

Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, andYb2Fe3O7 Types of Structures for Compounds in the In2O3 and Sc2O3—A2O3—BO Systems [A; Fe, Ga, or Al; B; Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples, ", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

SEMICONDUCTOR DEVICE AND MANUFACTURING METHOD THEREOF

BACKGROUND OF THE INVENTION

1. Field of the Invention

The present invention relates to a semiconductor including an oxide semiconductor. Note that here, semiconductor devices refer to general elements and devices which function utilizing semiconductor characteristics. For example, a memory, an arithmetic circuit, a rectifier, a display device, and the like which include a semiconductor can be given as semiconductor devices; however, the present invention is not limited thereto. For example, Patent Document 1 can be referred to for a memory including a semiconductor.

2. Description of the Related Art

In recent years, a transistor, a display device, a memory, and the like manufactured using a composite oxide of indium, gallium, and zinc have been reported (for example, see Patent Documents 2 to 5).

REFERENCE

[Patent Document 1] U.S. Pat. No. 7,468,901
[Patent Document 2] U.S. Pat. No. 7,674,650
[Patent Document 3] United States Patent Application Publication No. 2011/0058116
[Patent Document 4] United States Patent Application Publication No. 2011/0216571
[Patent Document 5] United States Patent Application Publication No. 2011/0278571

SUMMARY OF THE INVENTION

An object of one embodiment of the present invention is to provide a novel integrated circuit including at least two transistors which are formed using an oxide semiconductor and a method for manufacturing the integrated circuit. Other objects will be apparent from and can be derived from the description of the specification, the drawings, the claims, and the like.

Structures which can solve the above problems are described below. Before the description of the structures, terms used in this specification are described. Note that in this specification and the like, a transistor is an element including at least three terminals, i.e., a gate, a drain, and a source. In addition, the transistor has a channel region between a drain (a drain terminal, a drain region, or a drain electrode) and a source (a source terminal, a source region, or a source electrode), and current can flow through the drain, the channel region, and the source.

Here, since the source and the drain of the transistor change depending on the structure, the operating condition, and the like of the transistor, it is difficult to define which is a source or a drain. Thus, a portion which functions as the source and a portion which functions as the drain are not called a source and a drain and one of the source and the drain is referred to as a first electrode and the other thereof is referred to as a second electrode in some cases.

Also in the case of an element having two terminals, such as a capacitor or a diode, one electrode is referred to a first electrode and the other electrode is referred to as a second electrode in some cases. In this case, even when a positive electrode and a negative electrode are distinguished from each other in the capacitor or the diode, "the first electrode" does not indicate whether the one electrode is the positive electrode or is the negative electrode. However, when it is necessary to specify the positive electrode and the negative electrode because of the characteristics of the circuit, description is additionally made in some cases.

Note that in this specification and the like, terms such as "first", "second", and "third" are used for distinguishing various elements, members, regions, layers, and areas from others. Therefore, the terms such as "first", "second", "third", and the like do not limit the number of the elements, members, regions, layers, areas, or the like. Further, for example, it is possible to replace "first" with "second", "third", or the like.

Note that in this specification and the like, when it is explicitly described that X and Y are connected, the case where X and Y are electrically connected, the case where X and Y are functionally connected, and the case where X and Y are directly connected are included therein. Here, each of X and Y denotes an object (e.g., a device, an element, a circuit, a wiring, an electrode, a terminal, a conductive film, a layer, or the like). Accordingly, another connection relation shown in drawings and texts is included without being limited to a predetermined connection relation, for example, the connection relation shown in the drawings and the texts.

For example, in the case where X and Y are electrically connected, one or more elements which enable electrical connection between X and Y (e.g., a switch, a transistor, a capacitor, an inductor, a resistor, and/or a diode) can be connected between X and Y.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that "X and Y are electrically connected", the description is the same as the case where it is explicitly only described that "X and Y are connected".

Note that in this specification and the like, it might be possible for those skilled in the art to constitute one embodiment of the invention even when portions to which all the terminals of an active element (e.g., a transistor), a passive element (e.g., a capacitor), or the like are connected are not specified. In particular, in the case where the number of portions to which the terminal is connected might be plural, it is not necessary to specify the portions to which the terminal is connected. Thus, it might be possible to constitute one embodiment of the invention by specifying only portions to which some of terminals of an active element, a passive element, or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified.

Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, explicit singular forms preferably mean singular forms. However, without being limited thereto, such singular forms can include plural forms. Similarly, explicit plural forms preferably mean plural forms. However, without being limited thereto, such plural forms can include singular forms.

One embodiment of the present invention is a semiconductor device which includes a first transistor and a second transistor each including an oxide semiconductor. A second electrode of the first transistor and a first electrode of the second transistor are connected to each other. The first transistor has a gate, a first electrode, and the second electrode which are in an offset state (hereinafter, referred to as an offset transistor).

One embodiment of the present invention is a semiconductor device which includes a first transistor including an oxide semiconductor, a first capacitor, a second transistor including an oxide semiconductor, and a second capacitor. A second electrode of the first transistor, a first electrode of the second transistor, and a first electrode of the first capacitor are connected to one another. A second electrode of the second transistor is connected to a first electrode of the second capacitor. A second electrode of the first capacitor and a second electrode of the second capacitor are connected to nodes different from a gate of the first transistor and a gate of the second transistor. The first transistor is an offset transistor.

One embodiment of the present invention is a semiconductor device which includes a first transistor including an oxide semiconductor, a capacitor, a second transistor including an oxide semiconductor, and a flip-flop circuit. A second electrode of the first transistor, a first electrode of the capacitor, and a gate of the second transistor are connected to one another. A second electrode of the capacitor is connected to a node different from a gate of the first transistor. A first electrode of the second transistor is connected to the flip-flop circuit.

In the above semiconductor device, the second transistor may be a transistor whose gate overlaps with a first electrode or a second electrode (hereinafter, referred to as an overlap transistor). In the above semiconductor device, the second transistor may be an offset transistor.

One embodiment of the present invention is a method for manufacturing a semiconductor device that includes the following steps: forming a first electrode of a first transistor and a second electrode of a second transistor; forming an oxide semiconductor film; forming a gate of the first transistor, a gate of the second transistor, a second electrode of a first capacitor, and a second electrode of a second capacitor; forming a mask covering at least the first electrode and the gate of the first transistor; and mixing an impurity into the oxide semiconductor film. The first electrode and the gate of the first transistor, and the second electrode and the gate of the second transistor are in an offset state.

One embodiment of the present invention is a method for manufacturing a semiconductor device that includes the following steps: forming an oxide semiconductor film; forming a gate of a first transistor and a gate of a second transistor; forming a mask covering at least the gate of the first transistor; mixing an impurity into the oxide semiconductor film; forming a first electrode of the first transistor and a second electrode of the second transistor; and forming a second electrode of a first capacitor and a second electrode of a second capacitor. The first electrode and the gate of the first transistor are in an offset, and the second electrode and the gate of the second transistor are in an offset.

An oxide semiconductor to be used preferably contains at least indium (In) or zinc (Zn). In particular, In and Zn are preferably contained. As a stabilizer for reducing variation in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, for example, an In—Ga—Zn-based oxide means an oxide containing In, Ga, and Zn as its main component, and there is no particular limitation on the ratio of In, Ga, and Zn. Further, the In—Ga—Zn-based oxide may contain a metal element other than In, Ga, and Zn.

Alternatively, a material represented by $InMO_3(ZnO)_m$ (m>0 and m is not an integer) may be used as the oxide semiconductor. Here, M represents one or more metal elements selected from Ga, Fe, Mn, and Co. Alternatively, as the oxide semiconductor, a material represented by $In_2SnO_5(ZnO)_n$ (n>0 and n is an integer) may be used.

For example, an In—Ga—Zn-based oxide with an atomic ratio of In:Ga:Zn=1:1:1 (=1/3:1/3:1/3) or 2:2:1 (=2/5:2/5:1/5) or any of oxides whose composition is in the neighborhood of the above compositions can be used. Alternatively, an In—Sn—Zn-based oxide with an atomic ratio of In:Sn:Zn=1:1:1 (=1/3:1/3:1/3), 2:1:3 (=1/3:1/6:1/2), or 2:1:5 (=1/4:1/8:5/8), or any of oxides whose composition is in the neighborhood of the above compositions may be used.

However, the present invention is not limited to the above compositions, and a material having an appropriate composition may be used depending on necessary semiconductor characteristics (e.g., mobility, threshold voltage, and variation). In order to obtain necessary semiconductor characteristics, it is preferable that the carrier concentration, the impurity concentration, the defect density, the atomic ratio of a metal element to oxygen, the interatomic distance, the density, and the like be set to appropriate values.

For example, with an In—Sn—Zn-based oxide, a high mobility can be obtained with relative ease. However, mobility can be increased by reducing the defect density in a bulk also in the case of using the In—Ga—Zn-based oxide.

Note that for example, the expression "the composition of an oxide containing In, Ga, and Zn at the atomic ratio, In:Ga:

Zn=a:b:c (a+b+c=1), is in the neighborhood of the composition of an oxide containing In, Ga, and Zn at the atomic ratio, In:Ga:Zn=A:B:C (A+B+C=1) means that a, b, and c satisfy the following relation: $(a-A)^2+(b-B)^2+(c-C)^2 \le r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a crystalline portion or a non-amorphous structure.

In the case of an oxide semiconductor in an amorphous state, a flat surface can be obtained with relative ease, so that when a transistor is manufactured with the use of such an oxide semiconductor, interface scattering can be reduced, and relatively high mobility can be obtained with relative ease.

In an oxide semiconductor having crystallinity, defects in the bulk can be further reduced and when surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with an average surface roughness ($R_a$) of less than or equal to 1 nm, preferably less than or equal to 0.3 nm, further preferably less than or equal to 0.1 nm.

Note that $R_a$ is obtained by expanding, into three dimensions, center line average roughness that is defined by JIS B 0601 so as to be applied to a plane. The $R_a$ can be expressed as an "average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| dx dy \quad \text{[Formula 1]}$$

In the above formula, $S_0$ represents the area of a plane to be measured (a quadrangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured using an atomic force microscope (AFM).

In the case where the oxide semiconductor film has crystallinity, an oxide semiconductor film including a crystal with c-axis alignment (also referred to as a c-axis aligned crystalline oxide semiconductor (CAAC-OS) film), which has a triangular or hexagonal atomic arrangement when seen from the direction of an a-b plane, a surface, or an interface may be used. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, a CAAC-OS means a non-single-crystal oxide semiconductor including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC-OS is not a single crystal but this does not mean that the CAAC-OS is composed of only an amorphous component. Although the CAAC-OS includes a crystallized portion (a crystalline portion), a boundary between one crystalline portion and another crystalline portion is not clear in some cases.

In the case where the CAAC-OS includes oxygen, nitrogen may be substituted for part of oxygen included in the CAAC-OS. The c-axes of crystalline portions included in the CAAC-OS may be aligned in a certain direction (e.g., a direction perpendicular to a surface of a substrate over which the CAAC-OS is formed or a surface of the CAAC-OS). Alternatively, the normals of the a-b planes of the crystalline portions included in the CAAC-OS may be aligned in a certain direction (e.g., a direction perpendicular to a surface of a substrate over which the CAAC-OS is formed or a surface of the CAAC-OS).

The CAAC-OS can be a conductor, a semiconductor, or an insulator depending on its composition or the like. Further, the CAAC-OS transmits or does not transmit visible light depending on its composition or the like.

An example of such a CAAC-OS film is a crystal which has a triangular or hexagonal atomic arrangement when observed from the direction perpendicular to a surface of the film or a surface of a substrate over which the CAAC-OS is formed, and in which metal atoms are arranged in a layered manner or metal atoms and oxygen atoms (or nitrogen atoms) are arranged in a layered manner when a cross section of the film is observed.

An offset transistor has lower off-state current (leakage current flowing between a source and a drain in an off state) than a non-offset transistor. Further, the non-offset transistor has higher on-state current (current flowing between a source and a drain in an on state) than the offset transistor.

Those are described based on results of numerical calculation using gate voltage (potential difference between a source and a gate, $V_G$) dependence of a drain current (current between a source and a drain, $I_D$) of a transistor whose channel includes an ideal oxide semiconductor without a defect inside the semiconductor.

As the oxide semiconductor, an oxide semiconductor in which the ratio of indium (In), tin (Sn), and zinc (Zn) is 1:1:1 is assumed. Before the numerical calculation, a transistor is manufactured using an oxide having such a composition, and it is found that the defect density in the bulk is approximately $1 \times 10^{12}/cm^2$ and that the mobility in the case where no defect exists in the bulk is 120 $cm^2/V \cdot s$ owing to its characteristics.

Note that even when no defect exists inside a semiconductor, scattering at an interface between a channel and a gate insulator affects the transport property of the transistor. In other words, the mobility $\mu_1$ at a position that is distance x away from the interface between the channel and the gate insulator can be expressed as the following formula.

$$\frac{1}{\mu_1} = \frac{1}{\mu_0} + \frac{D}{B}\exp\left(-\frac{x}{G}\right) \quad \text{[Formula 2]}$$

Here, D represents the electric field in the gate direction, and B and G are constants. B and G can be obtained from actual measurement results; according to the above measurement results, B is $4.75 \times 10^7$ cm/s and G is 10 nm (the depth to which interface scattering reaches). When D is increased (i.e., when the gate voltage is increased), the second term of Formula 2 is increased and accordingly the field-effect mobility $\mu_1$ is decreased.

Based on the above results, FIG. 7 shows calculation results of drain current only in consideration of interface scattering. Note that a potential of a source is 0 V, and a potential of a drain is +1 V. For the numerical calculation, device numerical calculation software Sentaurus Device manufactured by Synopsys, Inc. is used, and the relative permittivity, the bandgap, the electron affinity, and the thickness of the oxide semiconductor are assumed to be 15, 2.8 eV, 4.7 eV, and 15 nm, respectively. These values are obtained by measurement of a thin film that is formed by sputtering.

FIGS. 6A and 6B illustrate cross-sectional structures of the transistors used for the numerical calculation. The transistors illustrated in FIGS. 6A and 6B each include a semiconductor region 603a and a semiconductor region 603c that have n-type conductivity in an oxide semiconductor layer. The resistivities of the semiconductor regions 603a and 603c are $2 \times 10^{-3}$ Ωcm.

The transistor illustrated in FIG. 6A is formed over a base insulator 601 and an embedded insulator 602 which is embedded in the base insulator 601 and formed of aluminum oxide. The transistor includes the semiconductor region 603a, the semiconductor region 603c, an intrinsic semiconductor region 603b serving as a channel formation region therebetween, and a gate 605. The width of the gate 605 is 33 nm.

A gate insulator 604 is formed between the gate 605 and the semiconductor region 603b. In addition, a sidewall insulator 606a and a sidewall insulator 606b are formed on both side surfaces of the gate 605, and an insulator 607 is formed over the gate 605 to prevent a short circuit between the gate 605 and another wiring. The width of the sidewall insulator is 5 nm. A source 608a and a drain 608b are provided in contact with the semiconductor region 603a and the semiconductor region 603c, respectively. Note that the channel width of this transistor is 40 nm.

In the numerical calculation, the work functions of the gate 605, the source 608a, and the drain 608b are assumed to be 5.5 eV, 4.6 eV, and 4.6 eV, respectively. The thickness of the gate insulator 604 is assumed to be 100 nm, and the relative dielectric constant thereof is assumed to be 4.1. The channel length and the channel width are 33 nm and 40 nm, respectively.

The transistor in FIG. 6B is the same as the transistor in FIG. 6A in that it is formed over the base insulator 601 and the embedded insulator 602 formed of aluminum oxide and that it includes the semiconductor region 603a, the semiconductor region 603c, the intrinsic semiconductor region 603b provided therebetween, the gate 605 having a width of 33 nm, the gate insulator 604, the sidewall insulator 606a, the sidewall insulator 606b, the insulator 607, the source 608a, and the drain 608b.

The transistor in FIG. 6A is different from the transistor in FIG. 6B in the conductivity type of semiconductor regions under the sidewall insulator 606a and the sidewall insulator 606b. In the transistor in FIG. 6A, the semiconductor regions under the sidewall insulator 606a and the sidewall insulator 606b are part of the semiconductor region 603a having n-type conductivity and part of the semiconductor region 603c having n-type conductivity, whereas in the transistor in FIG. 6B, the semiconductor regions under the sidewall insulator 606a and the sidewall insulator 606b are part of the intrinsic semiconductor region 603b.

In other words, a region (offset region) having a width of $L_{off}$ which overlaps with neither the semiconductor region 603a (semiconductor region 603c) nor the gate 605 is provided. The width $L_{off}$ is called an offset length. As is seen from the drawing, the offset length is equal to the width of the sidewall insulator 606a (sidewall insulator 606b). Note that the transistor in FIG. 6A has a width $L_{off}$ of 0 nm and is neither an offset transistor nor an overlap transistor. In this specification, such a transistor is called an aligned transistor.

Actually, it is impossible to obtain a structure with neither overlap nor offset, and slight overlap or offset is inevitable; however, an island transistor may used as a transistor having a structure between overlap and offset.

In FIG. 7, a dotted line indicates characteristics of a transistor having the structure in FIG. 6A (aligned transistor, $L_{off}=0$ nm), and a solid line indicates characteristics of a transistor having the structure in FIG. 6B (offset transistor, $L_{off}=15$ nm).

Since an oxide semiconductor has a bandgap of greater than or equal to 2.5 eV, the number of thermally excited carriers is small and extremely high resistance can be obtained in an off state. However, unlike in a silicon semiconductor, channel doping to suppress a short-channel effect cannot be performed; therefore, the drain current is greater than or equal to 1 pA at a gate voltage of 0 V.

The offset transistor (FIG. 6B) has lower off-state current than the aligned transistor (FIG. 6A). As compared to the transistor in FIG. 6A, the drain current is smaller by 3 orders of magnitude at a gate voltage of 0 V and smaller by 6 or more orders of magnitude at a gate voltage of −1 V. However, on-state current of an offset transistor is lower than that of a non-offset transistor. At a gate voltage of +1 V, the drain current of the transistor in FIG. 6B is approximately ⅓ of that of the transistor in FIG. 6A.

With a structure according to one embodiment of the present invention, an offset transistor and a non-offset transistor (e.g., an aligned transistor or an overlap transistor) can be formed over one substrate at the same time. In other words, in a circuit, a non-offset transistor can be used in a portion where high on-state current is preferable, and an offset transistor can be used in a portion where low off-state current is preferable.

DETAILED DESCRIPTION OF THE INVENTION

Figure 1A:
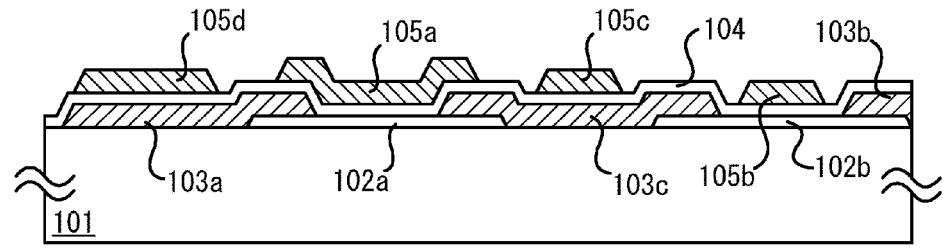
FIGS. 1A to 1D illustrate examples of cross-sectional schematic views and a circuit of semiconductor devices of embodiments of the present invention.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

Size, the thickness of layers, or regions in drawings are exaggerated for simplicity in some cases. Therefore, the embodiments of the present invention are not limited to such scales.

Note that drawings are schematic views of ideal examples, and the embodiments of the present invention are not limited to the shape or the value illustrated in the drawings. For example, variation in shape due to a manufacturing technique or dimensional deviation can be included.

Further, technical terms are often used in order to describe a specific embodiment, example, or the like. Note that one embodiment of the invention is not construed as being limited by the technical terms.

In addition, terms which are not defined (including terms used for science and technology, such as technical terms or academic parlance) in this specification can be used as terms which have meaning equal to general meaning that an ordinary person skilled in the art understands. It is preferable that terms defined by dictionaries or the like be construed as consistent meaning with the background of related art.

Note that what is described (or part thereof) in one embodiment can be applied to, combined with, or exchanged with another content in the same embodiment and/or what is described (or part thereof) in another embodiment or other embodiments.

Embodiment 1

FIG. 1A is a cross-sectional view of a semiconductor device of this embodiment. The semiconductor device includes a first oxide semiconductor layer 102a and a second oxide semiconductor layer 102b over a substrate 101. Further, a first layer wiring 103a is provided in contact with the first oxide semiconductor layer 102a, a first layer wiring 103b is provided in contact with the second oxide semiconductor layer 102b, and a first layer wiring 103c is provided in contact with the first oxide semiconductor layer 102a and the second oxide semiconductor layer 102b.

A gate insulator 104 is provided over the first oxide semiconductor layer 102a, the second oxide semiconductor layer 102b, and the first layer wirings 103a to 103c. A second layer wiring 105a, a second layer wiring 105b, a second layer wiring 105c, and a second layer wiring 105d are provided over the gate insulator 104.

The semiconductor device includes two transistors and two capacitors. The second layer wiring 105b serves as a gate of a first transistor, and the first layer wiring 103b serves as a first electrode of the first transistor. The second layer wiring 105a serves as a gate of a second transistor, and the first layer wiring 103a serves as a second electrode of the second transistor. The first layer wiring 103c serves as a second electrode of the first transistor and a first electrode of the second transistor. The first transistor is an offset transistor whose gate does not overlap with a first electrode and a second electrode, and the second transistor is an overlap transistor whose gate overlaps with a first electrode and a second electrode.

The second layer wiring 105c serves as a second electrode of a first capacitor. The second layer wiring 105d serves as a second electrode of a second capacitor. The first layer wiring 103a also serves as a first electrode of the second capacitor. The first layer wiring 103c also serves as a first electrode of the first capacitor.

Figure 1B:
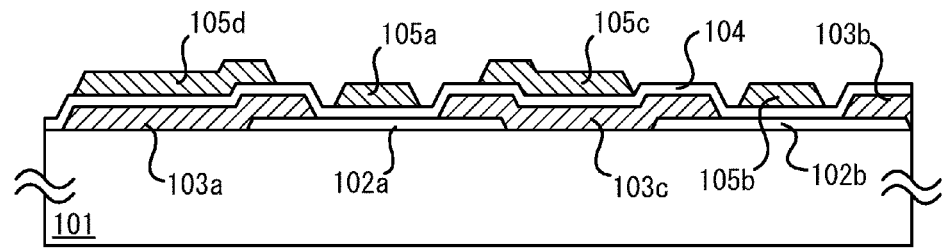
Figure 1C:
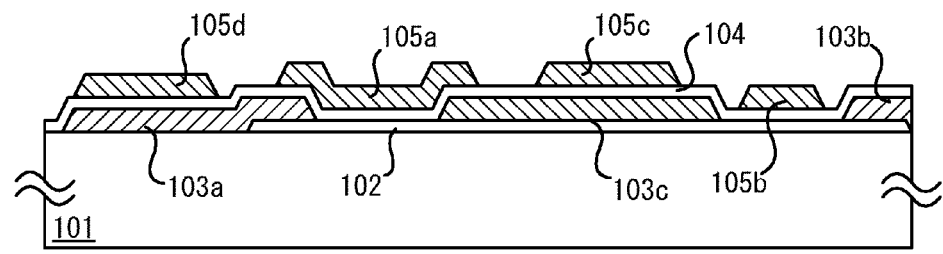
Figure 1D:
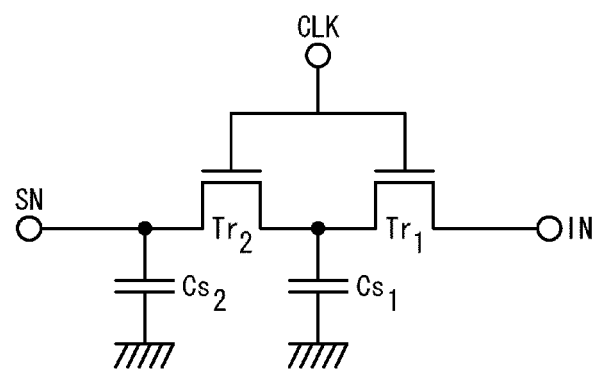
Figure 2A:
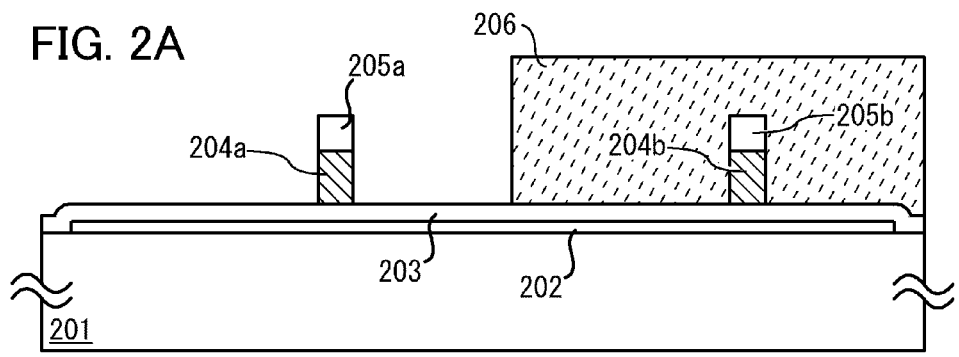
FIGS. 2A to 2D are cross-sectional views illustrating manufacturing steps of a semiconductor device of one embodiment of the present invention.
Figure 2B:
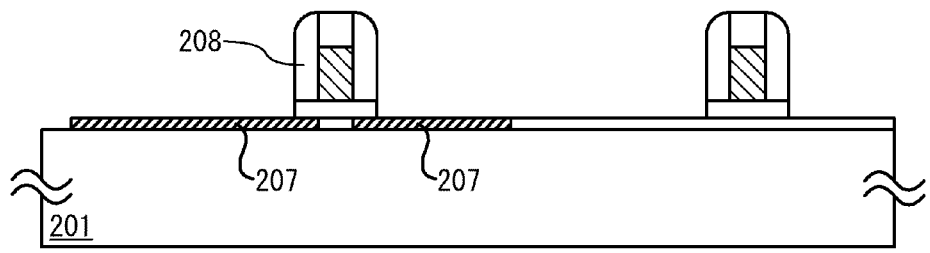
Figure 2C:
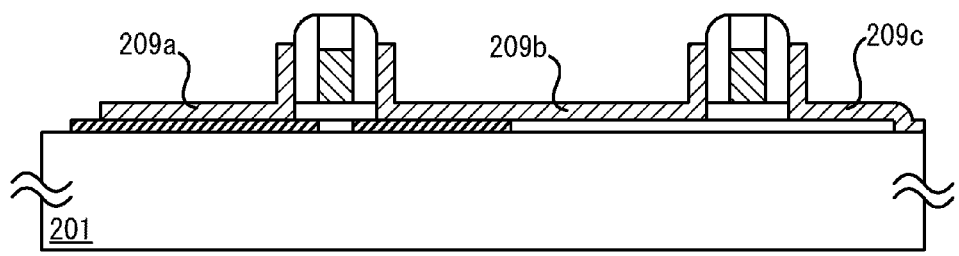
Figure 2D:
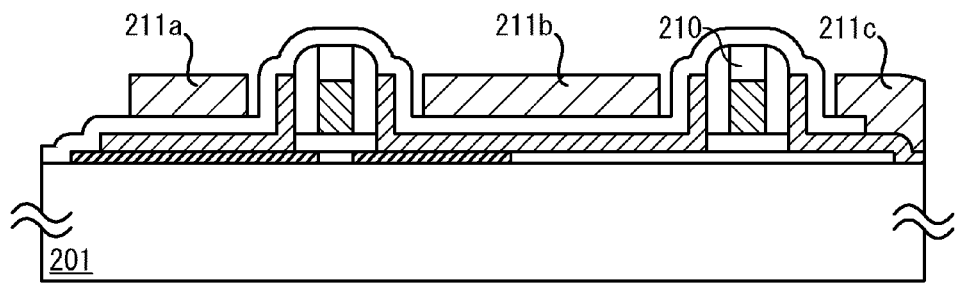

FIG. 1D illustrates a circuit including the two transistors and the two capacitors. Here, $Tr_1$ represents the first transistor; $Tr_2$, the second transistor; $Cs_1$, the first capacitor; and $Cs_2$, the second capacitor. The gate of the first transistor $Tr_1$ and the gate of the second transistor $Tr_2$ are connected to one signal terminal CLK, and the first transistor $Tr_1$ and the second transistor $Tr_2$ operate in conjunction with each other. For example, the first electrode of the first transistor $Tr_1$ is connected to an input terminal IN, and an input signal input to the first electrode of the first transistor $Tr_1$ is held in a storage node SN that is a node of the first electrode of the second capacitor $Cs_2$. Note that the gate of the first transistor $Tr_1$ and the gate of the second transistor $Tr_2$ may be apart from each other and supplied with different signals.

The first capacitor $Cs_1$ and the second capacitor $Cs_2$ may be capacitance which is unintentionally formed, such as capacitance between wirings or parasitic capacitance, instead of capacitance which is intentionally formed.

FIG. 1B illustrates a variation of a semiconductor device. A semiconductor device in FIG. 1B is the same as the semiconductor device in FIG. 1A except that the second transistor is an offset transistor.

FIG. 1C illustrates a variation of a semiconductor device. In a semiconductor device in FIG. 1C, one first oxide semiconductor layer 102 is provided, whereas two oxide semiconductor layers (the first oxide semiconductor layer 102a and the second oxide semiconductor layer 102b) are provided in the semiconductor device in FIG. 1A. The other structures are the same as those in the semiconductor device in FIG. 1A.

Embodiment 2

In this embodiment, a method for manufacturing an offset transistor and an aligned transistor over one oxide semiconductor layer will be described with reference to FIGS. 2A to 2D.

<FIG. 2A>

An oxide semiconductor layer 202 is formed over a substrate 201. A variety of substrates can be used as the substrate 201. For example, a single crystal silicon wafer, a glass substrate, a silicon on insulator (SOI) substrate, or the like can be used. The substrate 201 preferably has an insulating surface, and in the case where a semiconductor substrate or a conductive substrate is used, an insulating layer (hereinafter, referred to as a first insulating layer) is preferably provided on its surface. A circuit may be formed over the substrate 201, and the first insulating layer may be provided over the circuit.

The first insulating layer is preferably formed using an oxide, and it is much preferable that the first insulating layer include excessive oxygen. The hydrogen concentration of the first insulating layer is preferably sufficiently low and is more preferably lower than or equal to $1 \times 10^{19}$ cm$^{-3}$. For that purpose, it is preferable that at least a surface portion of the first insulating layer be formed by a sputtering method in an atmosphere in which the hydrogen concentration is sufficiently reduced. Note that silicon oxide is preferably used because the first insulating layer preferably has a low dielectric constant.

It is preferable that the surface of the first insulating layer be sufficiently flat, and the average surface roughness be less than or equal to 1 nm, preferably less than or equal to 0.3 nm, more preferably less than or equal to 0.1 nm. In particular, in the case where the oxide semiconductor layer 202 which is formed over the first insulating layer has crystallinity and the surface of the first insulating layer is not sufficiently flat, the crystallinity of the oxide semiconductor layer 202 is insufficient in some cases. Insufficient flatness causes variation in transistor characteristics. In order to obtain a flat surface, the surface of the first insulating layer is preferably planarized by a chemical mechanical polishing method. It is still preferable to perform plasma treatment on the surface of the first insulating layer after the planarization by a chemical mechanical polishing method.

The oxide semiconductor layer 202 is preferably formed using any of the above oxide semiconductors, and the thickness thereof is determined in consideration of the size of a transistor. The thickness of the oxide semiconductor layer 202 may be greater than or equal to 1 nm and less than or equal to 30 nm, for example. Alternatively, when a channel length is denoted by L, the thickness of the oxide semiconductor layer 202 may be greater than or equal to 1% and less than 10% of L.

The oxide semiconductor layer 202 can be obtained in such a manner that an oxide semiconductor film is etched to a necessary shape. The oxide semiconductor film is preferably formed by a sputtering method in an atmosphere including an oxygen gas at a substrate heating temperature of higher than or equal to 100° C. and lower than or equal to 600° C., preferably higher than or equal to 150° C. and lower than or equal to 550° C., and more preferably higher than or equal to 200° C. and lower than or equal to 500° C. In the case where a mixed atmosphere of an oxygen gas and a rare gas is used, the percentage of the oxygen gas is 30 vol. % or more, preferably 50 vol. % or more, and more preferably 80 vol. % or more.

As the substrate heating temperature at the time of film formation is higher, the impurity (hydrogen and the like) concentration of the obtained oxide semiconductor film is lower. Further, the atomic arrangement in the oxide semiconductor film is ordered and the density thereof is increased, so that a crystal is easily formed. The donor concentration of the oxide semiconductor film is preferably lower than or equal to $1 \times 10^{11}$ cm$^{-3}$.

Next, the gate insulator 203 is formed. The thickness of the gate insulator 203 is determined in consideration of the size of the transistor. The thickness of the gate insulator 203 may be greater than or equal to 5 nm and less than or equal to 30 nm, for example. Alternatively, when the channel length is denoted by L, the thickness of the gate insulator 203 may be less than 10% of L. The thickness of the gate insulator 203 is determined also in consideration of the dielectric constant, and when a material having a high dielectric constant is used, the thickness of the gate insulator 203 can be increased.

Note that it is further preferable that a dielectric constant $\in_1$ and a thickness $t_1$ of the oxide semiconductor layer 202, a dielectric constant $\in_2$ and a thickness $t_2$ of the gate insulator 203, and the channel length L of the transistor satisfy $(\in_2 t_1 + \in_1 t_2) < 0.1 \in_2 L$.

The gate insulator 203 can be formed by a sputtering method, an evaporation method, a PCVD method, a PLD method, an ALD method, or an MBE method. Silicon oxide, silicon nitride, silicon oxynitride, aluminum oxide, tantalum oxide, hafnium oxide, zirconium oxide, yttrium oxide, or the like may be used for the gate insulator 203. In this embodiment, a silicon oxide film is formed to a thickness of 100 nm by a sputtering method.

Next, a first conductive film for forming first layer wirings serving as gate electrodes is formed. The first conductive film can be formed using a metal material such as molybdenum, titanium, tantalum, tungsten, aluminum, copper, chromium, neodymium, or scandium, or an alloy material containing any of these materials as its main component.

The first conductive film may have a stacked-layer structure. For the lowermost layer, a metal oxide containing nitrogen, specifically, an In—Ga—Zn-based oxide containing nitrogen, an In—Sn-based oxide containing nitrogen, an In—Ga-based oxide containing nitrogen, an In—Zn-based oxide containing nitrogen, tin oxide containing nitrogen, indium oxide containing nitrogen, or a metal nitride film (InN, SnN, or the like), may be used.

These materials each have a work function of 5 eV or higher, preferably 5.5 eV or higher. Thus, any of these materials used for the gate electrode makes the threshold voltage of the transistor positive, so that a so-called normally-off switching element can be provided.

Further, a second insulating layer is formed over the first conductive film. For example, silicon oxide, silicon nitride, silicon oxynitride, aluminum oxide, or the like is formed. A material of the second insulating layer is preferably a material which serves as an etching stopper in a later anisotropic etching step.

Next, the first conductive film and the second insulating layer are processed through a photolithography process, whereby a first layer wiring 204a, a first layer wiring 204b, and an etching stopper 205a and an etching stopper 205b which are respectively provided over the first layer wiring 204a and the first layer wiring 204b are formed. A resist 206 is formed in a region where the offset transistor is to be provided (on the right side in FIG. 2A).

<FIG. 2B>

The oxide semiconductor layer 202 is doped with impurities using the resist 206, the first layer wiring 204a, and the etching stopper 205a provided over the first layer wiring 204a as masks. As examples of impurities to be used, phosphorus, boron, and nitrogen can be given; however, the impurities are not limited thereto. A substance which combines with oxygen contained in the oxide semiconductor and increases oxygen vacancies in the oxide semiconductor and the donor concentration of the oxide semiconductor may be used.

In this manner, n-type oxide semiconductor regions 207 are formed. The donor concentration of the n-type oxide semiconductor region 207 is preferably higher than or equal to $1 \times 10^{20}$ cm$^{-3}$. At this time, the boundaries of the n-type oxide semiconductor regions 207 are roughly aligned with both ends of the first layer wiring 204a.

After that, a third insulating layer is formed by a plasma CVD method or the like and subjected to anisotropic etching, whereby sidewall insulators 208 are formed. A known semiconductor technique (sidewall formation technique) can be referred to for this step. At this time, the gate insulator 203 is etched to expose the n-type oxide semiconductor regions 207 except portions under the sidewall insulators 208 and the first layer wirings 204a and 204b.

<FIG. 2C>

A second conductive film is formed. A material of the second conductive film may be selected from materials which can be used for the first conductive film. The second conductive film is etched, so that a second layer wiring 209a, a second layer wiring 209b, and a second layer wiring 209c are obtained. The second layer wiring 209a and the second layer wiring 209b are in contact with the n-type oxide semiconductor regions 207.

Through this step, a main part of the semiconductor device of this embodiment is formed. In other words, the first layer wiring 204b serves as the gate of the first transistor (offset transistor), the second layer wiring 209c serves as the first electrode of the first transistor, and the second layer wiring 209b serves as the second electrode of the first transistor. The first layer wiring 204a serves as the gate of the second transistor (aligned transistor), the second layer wiring 209b serves as the first electrode of the second transistor, and the second layer wiring 209a serves as the second electrode of the second transistor.

<FIG. 2D>

After that, capacitor insulators 210 are formed. The capacitor insulators 210 are used as dielectrics of capacitors. For that purpose, the thickness and the dielectric constant of the capacitor insulators are set as appropriate. For example, the thickness of the gate insulator 203 and the material of the gate insulator 203 may be referred to for the thickness and the dielectric constant of the capacitor insulators 210. In addition, a contact hole or the like may be provided in part of the capacitor insulator 210 as necessary.

After that, a third layer wiring 211a, a third layer wiring 211b, and a third layer wiring 211c are formed. The third layer wiring 211a and the second layer wiring 209a form a capacitor, and the third layer wiring 211b and the second layer wiring 209b form a capacitor. The third layer wiring 211a serves as a second electrode of a second capacitor, and the third layer wiring 211b serves as a second electrode of a first capacitor. Note that the second layer wiring 209a serves as a first electrode of the second capacitor, and the second layer wiring 209b serves as a first electrode of the first capacitor. The third layer wiring 211c is in contact with the second layer wiring 209c.

Further, a protective film or an interlayer insulator may be provided. In this manner, the offset transistor and the aligned transistor can be formed over the oxide semiconductor layer 202. Note that an overlap transistor or an offset transistor may be formed instead of the aligned transistor.

Embodiment 3

Figure 3A:
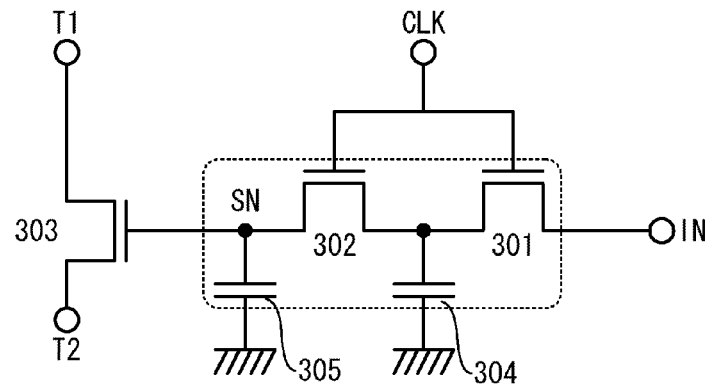
FIGS. 3A and 3B each illustrate a circuit of a semiconductor device of one embodiment of the present invention.

In this embodiment, an example where the circuit in FIG. 1D is used will be described. FIG. 3A illustrates a circuit of a memory element including the circuit in FIG. 1D. This memory element includes a circuit including a first transistor 301, a second transistor 302, a first capacitor 304, and a second capacitor 305 (a portion surrounded by a dotted line in the drawing) and a read transistor 303. The portion surrounded by the dotted line in the drawing is similar to the circuit in FIG. 1D.

The first transistor 301 is an offset transistor, and the second transistor 302 is any of an aligned transistor, an overlap transistor, and an offset transistor. Each of the first transistor 301 and the second transistor 302 includes an oxide semiconductor layer as described in Embodiment 1 or 2.

When data is input, a potential of a signal terminal CLK of gates of the first transistor 301 and the second transistor 302 is controlled so that the first transistor 301 and the second transistor 302 are turned on. Then, an input terminal IN has a potential based on data. As a result, potentials of the first electrodes of the first capacitor 304 and the second capacitor 305 (a potential of the storage node SN) can be set to potentials based on data.

The state of the read transistor 303 changes depending on the potential of the storage node SN of this circuit. In other words, when the potential of the storage node SN is high, the read transistor 303 is turned on in some cases, and when the potential of the storage node SN is low, the read transistor 303 is turned off. Therefore, held data can be determined by examination of conducting states of a first terminal T1 and a second terminal T2.

A memory element having a similar structure is known as a gain cell (for example, see Patent Document 1). The memory element of the circuit in FIG. 3A can hold data for a long time by including the first transistor 301 that is an offset transistor with low off-state current, as compared to a normal gain cell.

Figure 3B:
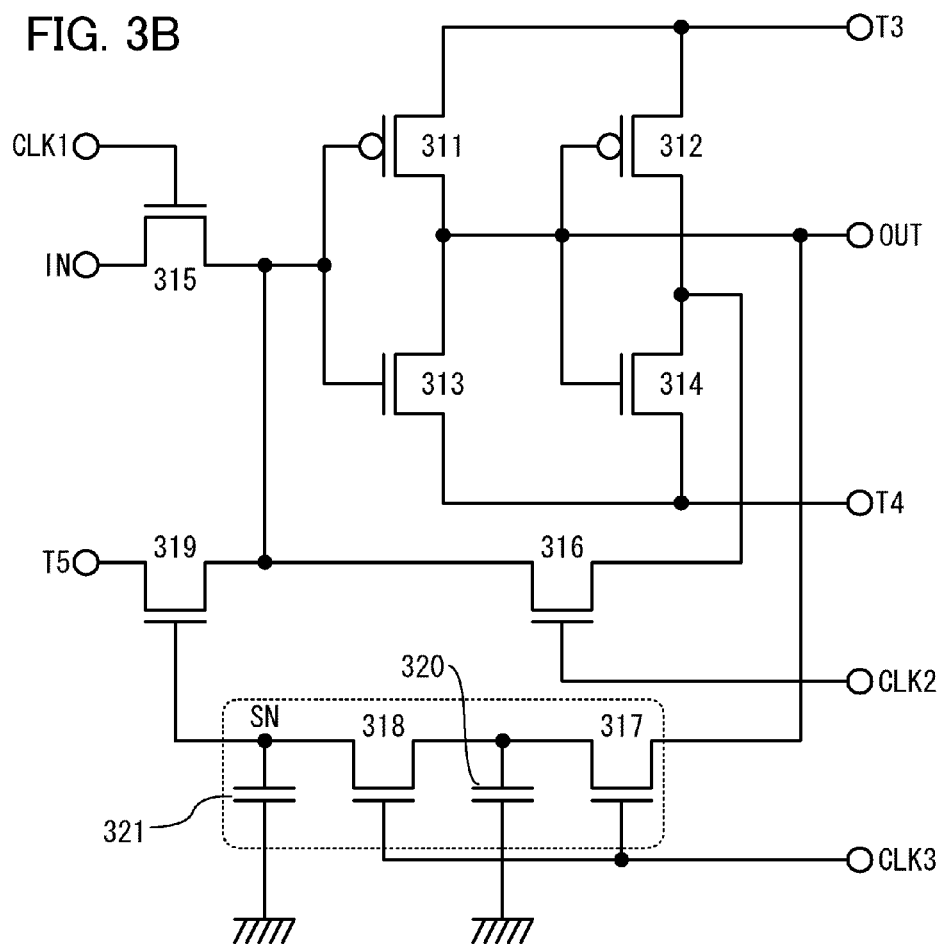

FIG. 3B illustrates a circuit of another memory element including the circuit in FIG. 1D. This memory element includes a circuit including a first transistor 317, a second transistor 318, a first capacitor 320, and a second capacitor 321 (a portion surrounded by a dotted line in the drawing) and a read transistor 319. The portion surrounded by the dotted line in the drawing is similar to the circuit in FIG. 1D. In addition, the portion surrounded by the dotted line and the read transistor 319 are similar to the circuit in FIG. 3A.

The first transistor 317 is an offset transistor, and the second transistor 318 is any of an aligned transistor, an overlap transistor, and an offset transistor. Each of the first transistor 317 and the second transistor 318 includes an oxide semiconductor layer as described in Embodiment 1 or 2.

The circuit in FIG. 3B includes a first inverter including a p-channel transistor 311 and an n-channel transistor 313, a second inverter including a p-channel transistor 312 and an n-channel transistor 314, and a first switching transistor 315 and a second switching transistor 316 which are connected to the first inverter and the second inverter. These form a flip-flop circuit. Such a circuit is used for a register or the like in a CPU, for example.

When data is written, the input terminal IN has a potential based on the data, a third terminal T3 has an appropriate high potential, a fourth terminal T4 has an appropriate low potential, and a potential of a signal terminal CLK1 of a gate of the first switching transistor 315 and a potential of a signal terminal CLK2 of a gate of the second switching transistor 316 are controlled, whereby the first switching transistor 315 and the second switching transistor 316 are turned on. The data is kept in a circuit, which has feedback loop, formed by the first inverter and the second inverter. After that, the first switching transistor 315 is turned off.

The stored data can be determined by reading a potential of an output terminal OUT. It needs to be noted that the potential of the output terminal OUT has a phase opposite to that of the potential supplied to the input terminal IN. For example, in the case where input data is "1" (the potential of the input terminal IN is +2 V) when the potential supplied to the input terminal IN at data of "1" is +2 V and the potential supplied to the input terminal IN at data of "0" is 0 V, the potential of the output terminal OUT is 0 V.

The above steady state is held in the case where the potentials of the third terminal T3 and the fourth terminal T4 are kept; however, when a potential difference between the third terminal T3 and the fourth terminal T4 is decreased, data is lost. In other words, in the case of using only the flip-flop circuit, a considerable amount of power is always consumed for holding data. However, by saving data in the portion surrounded by the dotted line in the drawing, power consumption of the memory element can be reduced.

In order to save data, the potential of a signal terminal CLK3 of the gates of the first transistor 317 and the second transistor 318 is controlled in a state where the flip-flop circuit is kept in the steady state so that the first transistor 317 and the second transistor 318 are turned on. As a result, the potential of the storage node SN is set to a potential based on the held data. In the above example, when the held data is "1", the potential of the storage node SN is 0 V, and when the held data is "0", the potential of the storage node SN is +2 V.

After that, the potential of the signal terminal CLK3 of the gates of the first transistor 317 and the second transistor 318 is controlled so that the first transistor 317 and the second transistor 318 are turned off. It is preferable that the first switching transistor 315 and the second switching transistor 316 be also turned off.

The potential of the storage node SN is held for a long time with the use of the first transistor 317 that is an offset transistor with low off-state current. Note that the potential of the storage node SN is changed from the initial value in some cases as time passes.

While data is saved in the above circuit, the potential of the signal terminal CLK3 may be lower than potentials of the other portions of the circuit. Thus, the potential of the storage node SN can be held for a longer time. There is an extremely small amount of current consumed in that case, and most current is gate leakage of the first transistor 317 and the second transistor 318 (leakage current between the gate and a drain and between the gate and a source), which is difficult to measure.

The saved data is restored as follows. First, the second switching transistor 316, the first transistor 317, and the second transistor 318 remain off. The first switching transistor 315 is turned on, and the potential of the input terminal IN is set to a potential based on data of "1" (+2 V in the above example). A potential of a fifth terminal T5 is preferably set to +2 V as well. Each of the third terminal T3 and the fourth terminal T4 is set to a predetermined potential. Thus, a potential of a gate of the first inverter is +2 V. After that, the first switching transistor 315 is turned off.

Next, the potential of the fifth terminal is set to 0 V. The read transistor 319 is off when the potential of the storage node SN is 0 V (or a potential close to 0 V); therefore, the potential of the gate of the first inverter remains +2 V. However, the read transistor 319 is on when the potential of the storage node SN is +2 V (or a potential close to +2 V); therefore, the potential of the gate of the first inverter is set to 0 V.

When the held data is "1", the potential of the storage node SN is 0 V (or a potential close to 0 V), and when the held data is "0", the potential of the storage node SN is +2 V (or a potential close to +2 V). Therefore, when the held data is "1", the potential of the gate of the first inverter is +2 V, and when the held data is "0", the potential of the gate of the first inverter is 0 V. This state is the same as the state in the case where the data is first input.

When the second switching transistor 316 is turned on in that state, the flip-flop circuit is in a steady state on the basis of the potential of the gate of the first inverter. This state is the same as the state before the data is saved.

Such a memory element may be formed in the following manner: the first inverter including the p-channel transistor 311 and the n-channel transistor 313, the second inverter including the p-channel transistor 312 and the n-channel transistor 314, and the first switching transistor 315 and the second switching transistor 316 which are connected to the first inverter and the second inverter are formed over a silicon wafer by a known semiconductor manufacture technique; and the first transistor 317 and the second transistor 318 are formed using an oxide semiconductor, over the circuit.

The read transistor 319 may be formed in the same layer as the transistor included in the flip-flop circuit. When the read transistor 319 is formed in the same layer as the first transistor 317 and the second transistor 318, a circuit can be formed in the same area as a conventional memory element; thus, the integration degree is not decreased.

Note that since the flip-flop circuit requires an area of 50 $F^2$ or more when the minimum feature size is F, the channel length of each of the first transistor 317 and the second transistor 318 may be 5 times or more as long as the channel length of the transistor included in the flip-flop circuit. In the case where the first transistor 317 and the second transistor 318 each have a long channel, the off-state characteristics can be improved.

Embodiment 4

In this embodiment, a method that can be used for manufacturing the memory element in FIG. 3B will be described with reference to FIGS. 4A to 4C and FIGS. 5A and 5B. Note that cross-sectional views illustrated in FIGS. 4A to 4C and FIGS. 5A and 5B do not illustrate specific cross sections of the memory element.

Figure 4A:
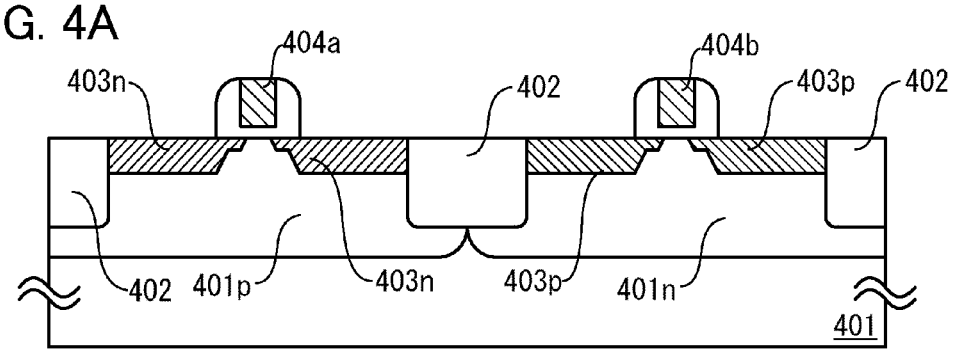
FIGS. 4A to 4C are cross-sectional views illustrating manufacturing steps of a semiconductor device of one embodiment of the present invention.

First, an n-well 401n, a p-well 401p, an element separation insulator 402, an n-type region 403n, a p-type region 403p, a first layer wiring 404a, and a first layer wiring 404b are formed over a substrate 401 (e.g., a silicon wafer) by a known technique for manufacturing a semiconductor integrated circuit (see FIG. 4A). The first layer wiring 404a and the first layer wiring 404b serve as gates of transistors.

Figure 4B:
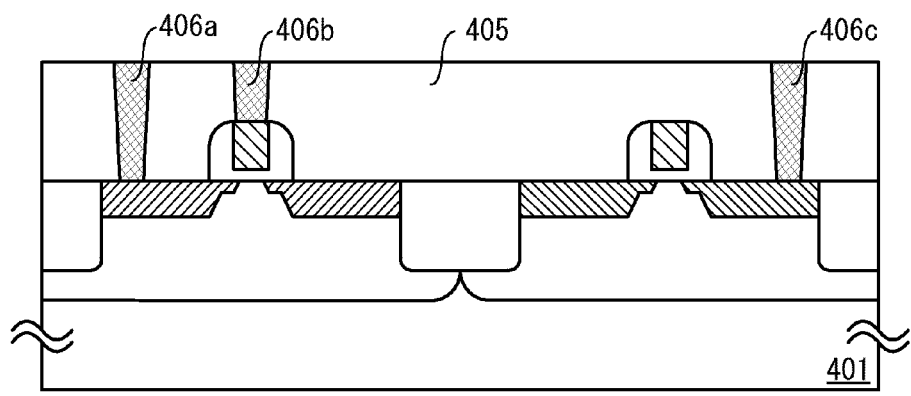

Further, a first interlayer insulator 405 is formed, a contact hole is formed, and a first contact plug 406a, a first contact plug 406b, and a first contact plug 406c are formed (see FIG. 4B).

Furthermore, a second interlayer insulator 407, a second layer wiring 408a, a second layer wiring 408b, a second layer wiring 408c, and a second layer wiring 408d are formed. The steps up to here can be performed by a known technique for manufacturing a semiconductor integrated circuit. Note that the second interlayer insulator 407 and the second layer wirings 408a to 408d each preferably have a sufficient flat surface as described in Embodiment 2. In addition, the second interlayer insulator 407 is preferably formed using a material similar to that of the first insulating layer in Embodiment 2.

Figure 4C:
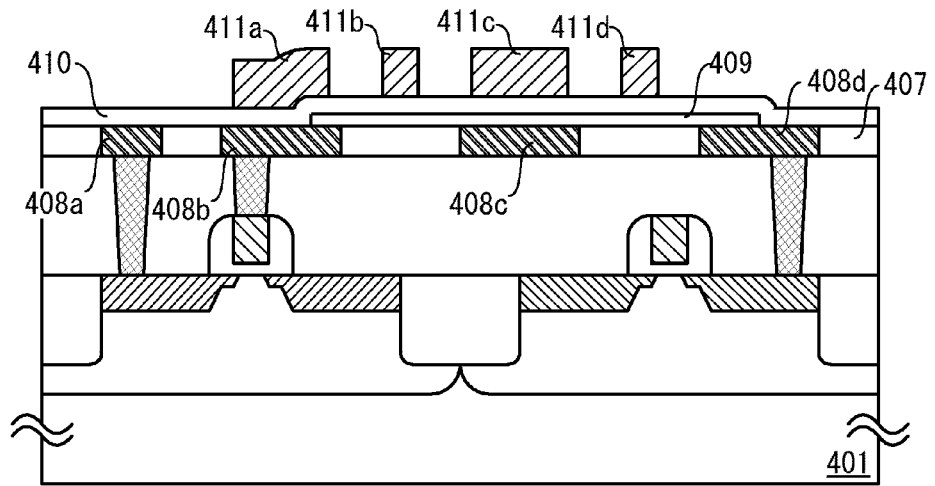

After that, an oxide semiconductor layer 409, a gate insulator 410, a third layer wiring 411a, a third layer wiring 411b, a third layer wiring 411c, and a third layer wiring 411d are formed (see FIG. 4C). Embodiment 2 may be referred to for formation of these.

Here, the third layer wiring 411b and the third layer wiring 411d serve as gate wirings of the transistors. In this embodiment, the third layer wiring 411b and the third layer wiring 411d are provided so as not to overlap with the second layer wirings 408a to 408d in portions where the third layer wirings 411b and 411d overlap with the oxide semiconductor layer 409.

In other words, as illustrated in the drawing, the second layer wiring 408b and the third layer wiring 411b, the second layer wiring 408c and the third layer wiring 411b, the second layer wiring 408c and the third layer wiring 411d, and the second layer wiring 408d and the third layer wiring 411d are set in an offset state with an appropriate offset length.

Figure 5A:
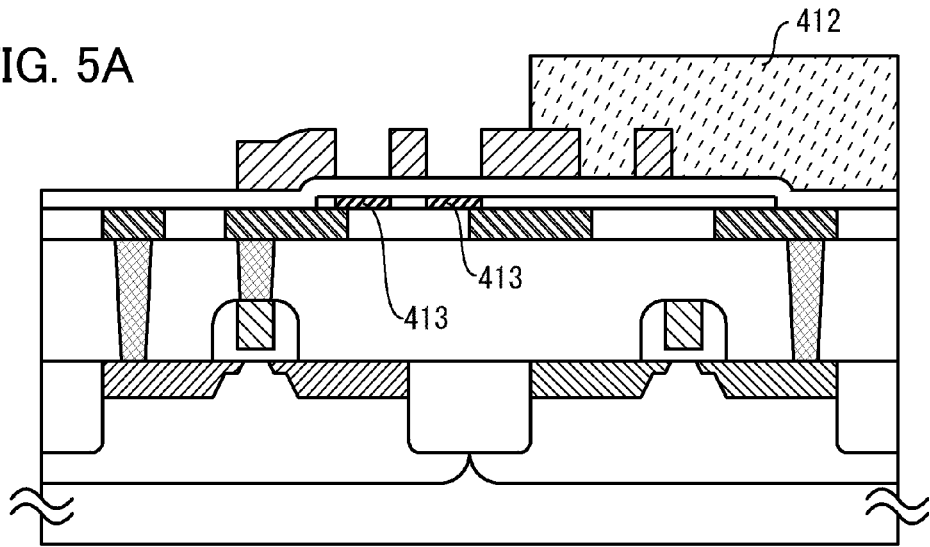
FIGS. 5A and 5B are cross-sectional views illustrating manufacturing steps of a semiconductor device of one embodiment of the present invention.

A portion where an offset transistor is to be manufactured is covered with a resist 412 and impurities are mixed into the oxide semiconductor layer 409, so that an n-type oxide semiconductor region 413 is formed (see FIG. 5A). Ends of the n-type oxide semiconductor regions 413 are roughly aligned with ends of the third layer wiring 411b; therefore, an aligned transistor can be formed. Embodiment 2 can be referred to for the details of this step.

Figure 5B:
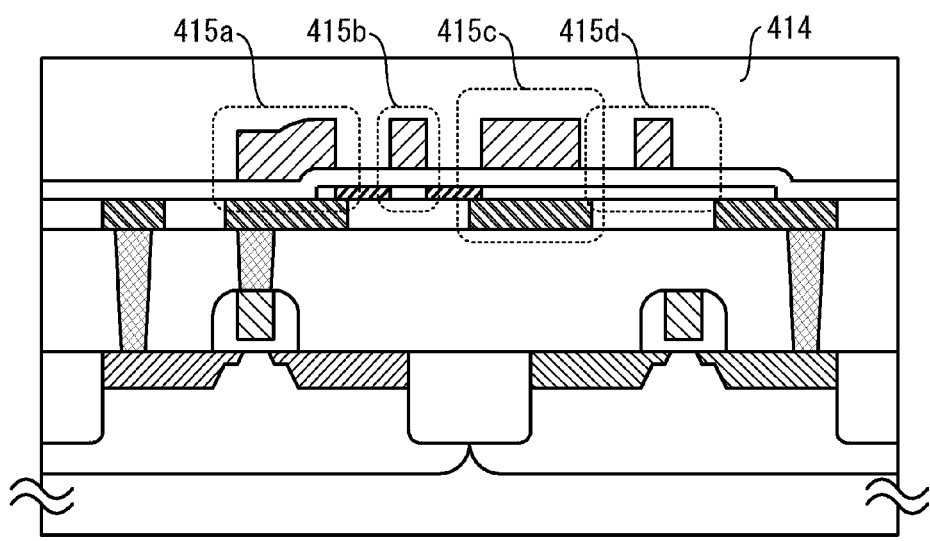
Figure 6A:
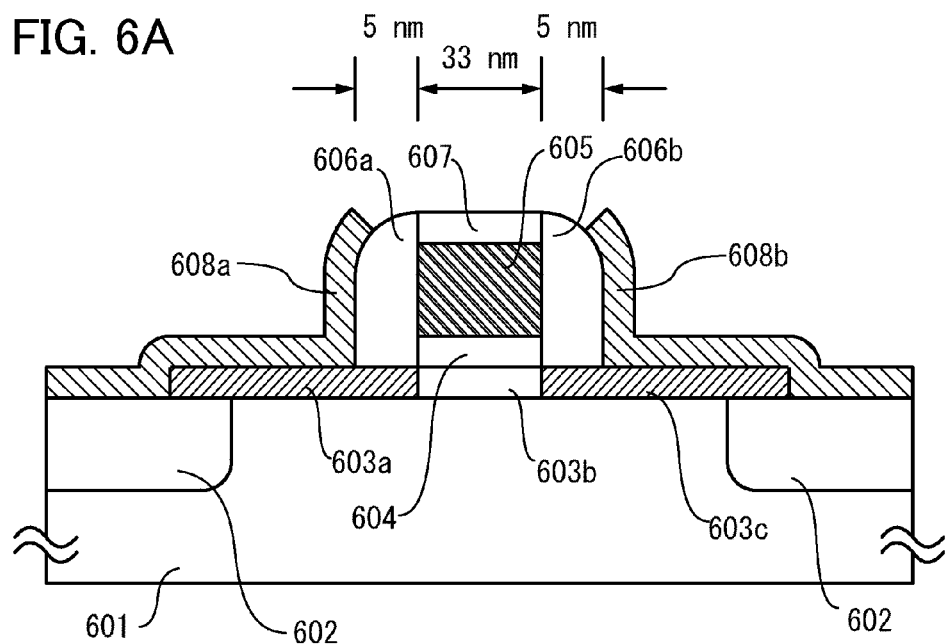
FIGS. 6A and 6B each illustrate a cross-sectional structure of a transistor used for numerical calculation.
Figure 6B:
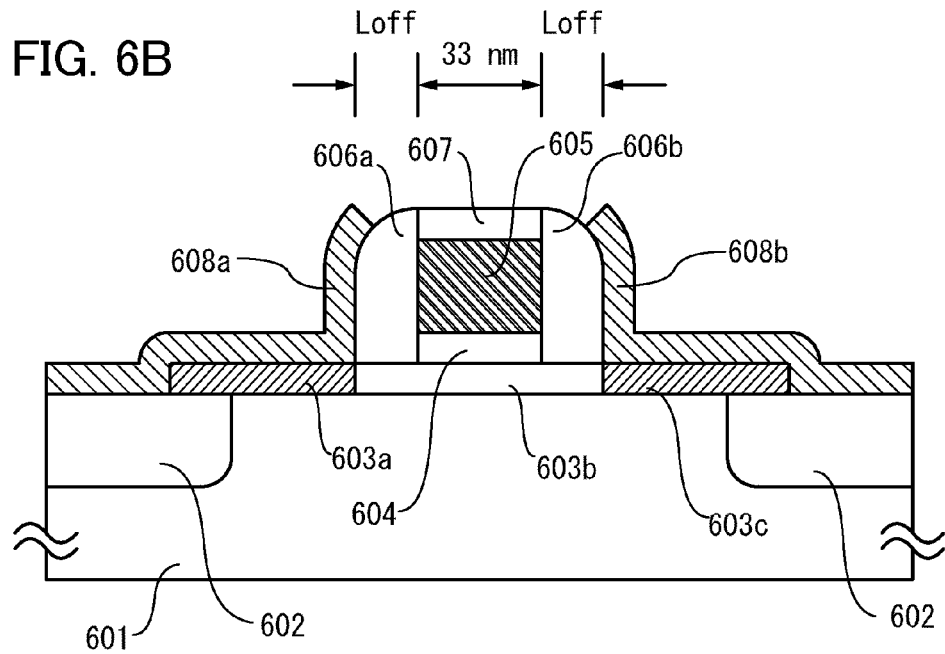
Figure 7:
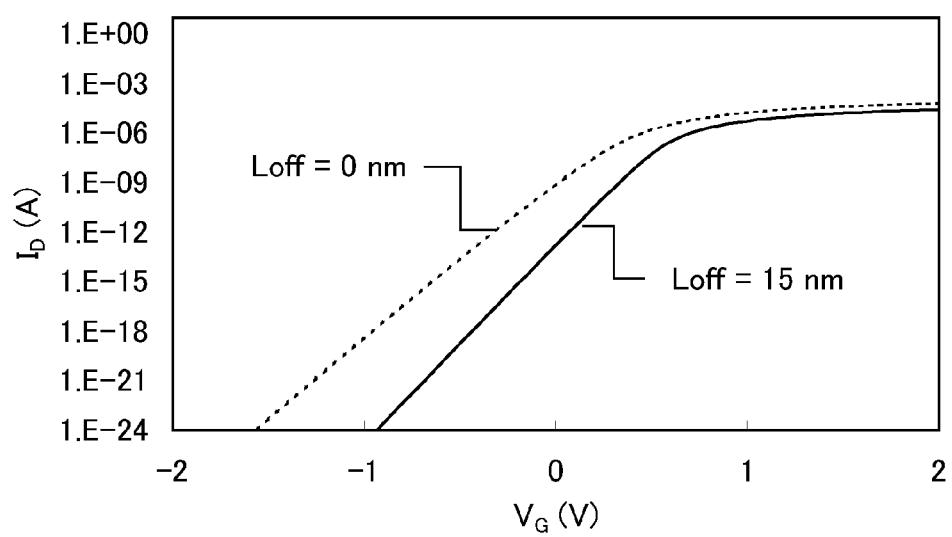
FIG. 7 shows numerical calculation results of characteristics of a transistor including an oxide semiconductor.

Further, a third interlayer insulator 414 is formed (see FIG. 5B). As described above, a first transistor 415d which is an offset transistor, a second transistor 415b which is an aligned transistor, a first capacitor 415c, and a second capacitor 415a can be formed.

The first transistor 415d, the second transistor 415b, the first capacitor 415c, and the second capacitor 415a can be used as the first transistor 301, the second transistor 302, the first capacitor 304, and the second capacitor 305 which are illustrated in FIG. 3A or the first transistor 317, the second transistor 318, the first capacitor 320, and the second capacitor 321 which are illustrated in FIG. 3B.

A transistor including the n-type region 403n, the p-type region 403p, the first layer wiring 404a, the first layer wiring 404b, and the like can be used as the p-channel transistor 311, the p-channel transistor 312, the n-channel transistor 313, the n-channel transistor 314, the first switching transistor 315, or the second switching transistor 316 in FIG. 3B. The transistor is formed in multiple layers as described above, whereby excellent characteristics can be obtained without reduction in integration degree of the circuit.

Embodiment 5

In this embodiment, the case where any of the semiconductor devices described in the above embodiments is applied to an electronic device will be described with reference to FIGS. 8A to 8C. In this embodiment, the cases where any of the above-described semiconductor devices is applied to electronic devices such as a computer, electronic paper, and a television device (also referred to as a TV or a television receiver) will be described.

Figure 8A:
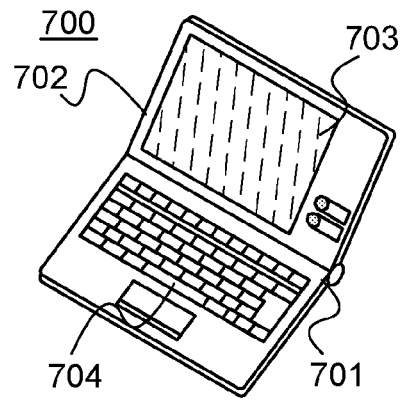
FIGS. 8A to 8C each illustrate an example of an electronic device.

FIG. 8A illustrates a notebook personal computer 700, which includes a housing 701, a housing 702, a display portion 703, a keyboard 704, and the like. At least one of the housings 701 and 702 is provided with the semiconductor device including the memory element described in any of the above embodiments. Thus, a notebook personal computer with sufficiently low power consumption, in which data can be stored for a long time, can be obtained.

Figure 8B:
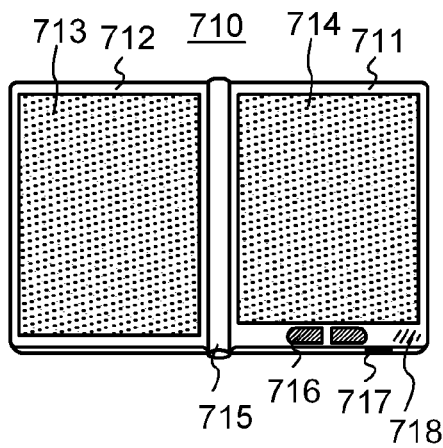

FIG. 8B illustrates an e-book reader 710 incorporating electronic paper, which includes two housings, a housing 711 and a housing 712. The housing 711 and the housing 712 include a display portion 714 and a display portion 713, respectively. The housing 711 is connected to the housing 712 by a hinge 715, so that the e-book reader can be opened and closed using the hinge 715 as an axis.

The housing 711 is provided with operation keys 716, a power button 717, a speaker 718, and the like. At least one of the housings 711 and 712 is provided with the semiconductor device including the memory element described in any of the above embodiments. Thus, an e-book reader with sufficiently low power consumption, in which data can be stored for a long time, can be obtained.

Figure 8C:
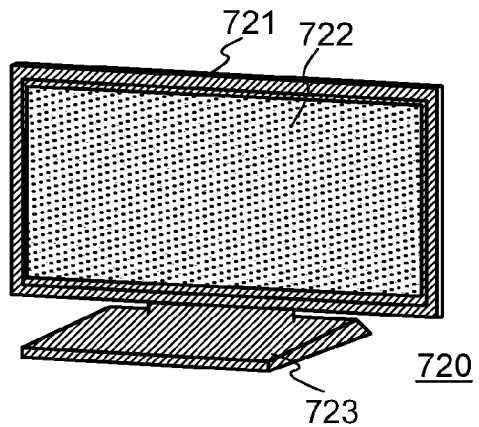

FIG. 8C is a television device 720, which includes a housing 721, a display portion 722, a stand 723, and the like. The housing 721 can be provided with the semiconductor device including the memory element described in any of the above embodiments. Thus, a television device with sufficiently low power consumption, in which data can be stored for a long time, can be obtained.

As described above, the memory element in any of the above embodiments is mounted on each of the electronic devices described in this embodiment. Therefore, electronic devices with low power consumption, in which data can be stored for a long time, can be obtained. It is needless to say that a similar effect can be obtained when an electronic device other than those illustrated in FIGS. 8A to 8C includes the semiconductor device according to any of the above embodiments.

This application is based on Japanese Patent Application serial No. 2011-117516 filed with Japan Patent Office on May 26, 2011, the entire contents of which are hereby incorporated by reference.

What is claimed is:

1. A semiconductor device comprising a first transistor and a second transistor,
   wherein the first transistor comprises:
      a first gate electrode;
      a first gate insulating layer adjacent to the first gate electrode;
      a first oxide semiconductor layer adjacent to the first gate electrode with the first gate insulating layer interposed therebetween; and
      a first source electrode and a first drain electrode in contact with the first oxide semiconductor layer,
   wherein the second transistor comprises:
      a second gate electrode;
      a second gate insulating layer adjacent to the second gate electrode;
      a second semiconductor layer adjacent to the second gate electrode with the second gate insulating layer interposed therebetween;
      a second source electrode and a second drain electrode in contact with the second oxide semiconductor layer;
      a first electrode adjacent to the second source electrode with the second gate insulating layer interposed therebetween; and
      a second electrode adjacent to the second drain electrode with the second gate insulating layer interposed therebetween,
   wherein the first electrode and the second electrode are provided in a same layer as the second gate electrode,
   wherein one of the first source electrode and the first drain electrode is connected to one of the second source electrode and the second drain electrode, and
   wherein the first source electrode and the first drain electrode do not overlap the first gate electrode.

2. The semiconductor device according to claim 1, wherein the second source electrode and the second drain electrode do not overlap the second gate electrode.

3. The semiconductor device according to claim 1, further comprising a third transistor comprising a third gate electrode,
   wherein the third gate electrode is connected to the other of the second source electrode and the second drain electrode.

4. The semiconductor device according to claim 1, wherein the first gate electrode is connected to the second gate electrode.

5. The semiconductor device according to claim 1, wherein each of the first oxide semiconductor layer and the second oxide semiconductor layer includes indium and zinc.

6. A semiconductor device comprising a first transistor, a second transistor, a first capacitor, and a second capacitor,
   wherein the first transistor comprises:
      a first gate electrode;
      a first gate insulating layer adjacent to the first gate electrode;
      a first oxide semiconductor layer adjacent to the first gate electrode with the first gate insulating layer interposed therebetween; and
      a first source electrode and a first drain electrode in contact with the first oxide semiconductor layer,
   wherein the second transistor comprises:
      a second gate electrode;
      a second gate insulating layer adjacent to the second gate electrode;
      a second semiconductor layer adjacent to the second gate electrode with the second gate insulating layer interposed therebetween; and a second source electrode and a second drain electrode in contact with the second oxide semiconductor layer, wherein the first capacitor comprises a first electrode adjacent to the second source electrode with the second gate insulating layer interposed therebetween, wherein the second capacitor comprises a second electrode adjacent to the second drain electrode with the second gate insulating layer interposed therebetween, wherein the first electrode and the second electrode are provided in a same layer as the second gate electrode, wherein one of the first source electrode and the first drain electrode is connected to one of the second source electrode and the second drain electrode, wherein one of the second source electrode and the second drain electrode is connected to the first capacitor, wherein the other of the second source electrode and the second drain electrode is connected to the second capacitor, and wherein the first source electrode and the first drain electrode do not overlap the first gate electrode.

7. The semiconductor device according to claim 6, wherein the second source electrode and the second drain electrode do not overlap the second gate electrode.

8. The semiconductor device according to claim 6, further comprising a third transistor comprising a third gate electrode, a third source electrode, and a third drain electrode, wherein the third gate electrode is connected to the other of the second source electrode and the second drain electrode.

9. The semiconductor device according to claim 6, wherein the first gate electrode is connected to the second gate electrode.

10. The semiconductor device according to claim 6, wherein the oxide semiconductor includes indium and zinc.

11. The semiconductor device according to claim 6, further comprising a flip-flop circuit, wherein the other of the second source electrode and the second drain electrode is connected to the flip-flop circuit.

* * * * *